Sept. 22, 1959 K. E. BARWICK 2,905,921
ELECTRICAL SOCKET MOUNTING UNIT
Filed Oct. 30, 1957

INVENTOR.
KEITH E. BARWICK.
BY
Wallace P. Lamb
ATTORNEY.

2,905,921

ELECTRICAL SOCKET MOUNTING UNIT

Keith E. Barwick, Detroit, Mich., assignor to Burroughs Corporation, Detroit, Mich., a corporation of Michigan Application October 30, 1957, Serial No. 693,328

4 Claims. (Cl. 339—17)

This invention relates generally to electronic apparatus and particularly to an electrical component assembly unit therefor.

It is an object of the invention to provide an improved electrical component assembly unit of the printed circuit board type for electronic apparatus.

Another object of the invention is to provide a circuit board and electrical component mounting structure of a character and arrangement to obtain a compact unit together with increased rigidity of the structure.

Specifically, it is an object of the invention to provide a compact electronic component assembly by mounting a tube socket on an edge of the circuit board using electrical conductors as braces to insure a rigid structure of inexpensive construction.

Other objects of the invention will become apparent from the following detail description taken in connection with the accompanying drawing in which.

Figure 4:
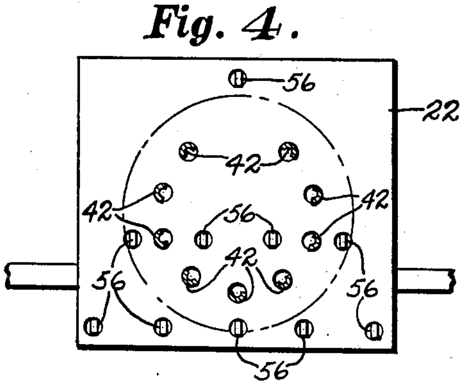
Fig. 4 is a front view partly in section, taken along line 4—4 of Fig. 3.
Figure 5:
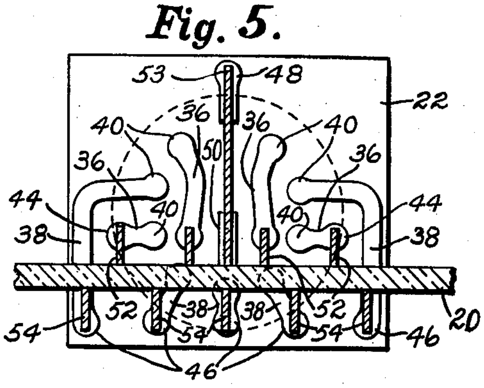
Fig. 5 is a rear view partly in section, taken along line 5—5 of Fig. 3.
Figures 3, 6:
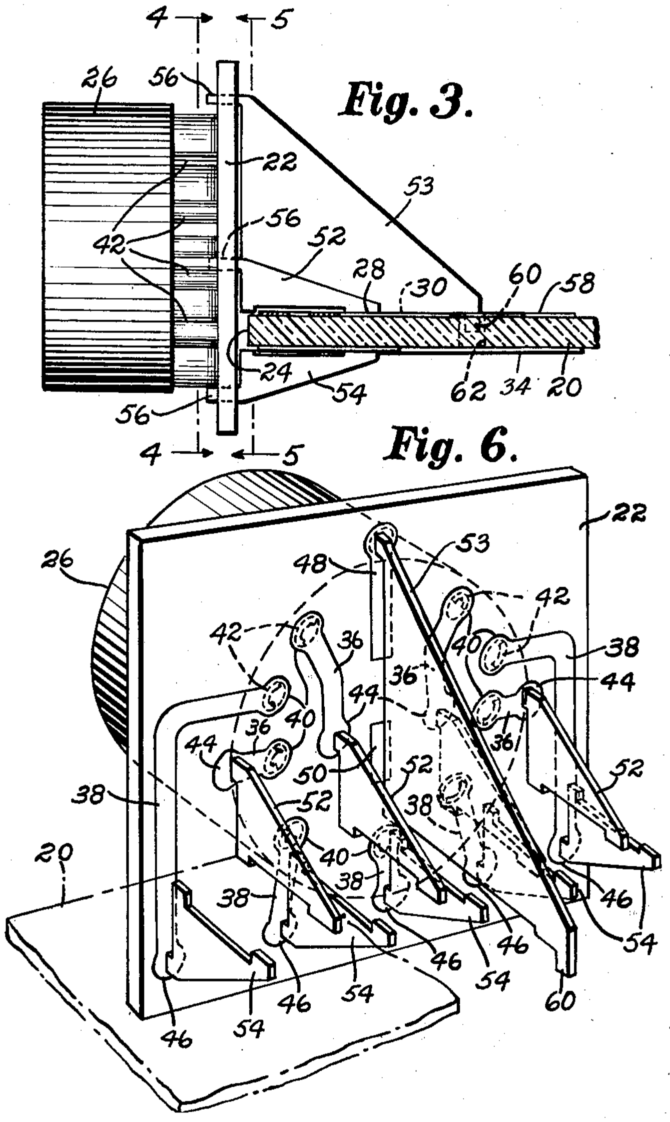
Fig. 3 is a side view partly in section, taken along line 3—3 of Fig. 1.
Fig. 6 is a perspective view.
Figure 1:
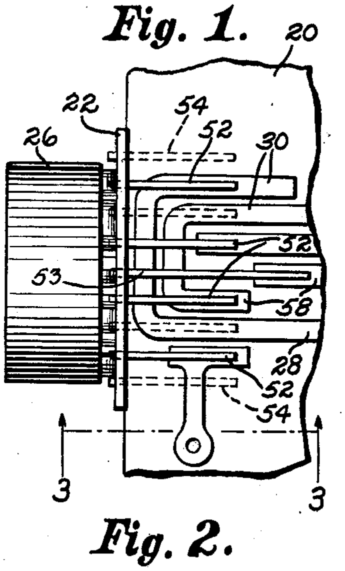
Fig. 1 is a fragmentary plan view of an electronic component assembly, embodying features of the invention.
Figure 2:
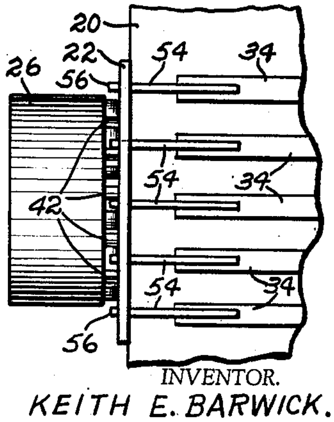
Fig. 2 is a fragmentary bottom view of the electronic component assembly.

Referring to the drawing by characters of reference, the electronic component assembly shown has a mounting structure including a circuit board 20 and an electronic tube socket plate 22. The plate 22 is mounted on an end edge 24 of the board 20 to provide for compactness of the assembly in the direction of the thickness of the board, and supports a socket 26 on the opposite side of the plate 22 from the board, the socket 26 being of the type for receiving an electronic tube (not shown).

The board 20 is generally rectangular in shape and may be made of a plastic or other suitable electrical insulating material. On one side surface of the board 20 are printed circuits having conductors 28 arranged in a pattern for electrically connecting electrical components (not shown), that are also mounted on the board. On the printed circuit side of the board 20, some of the conductors 28 have parallel portions 30 that are looped adjacent the end edge 24 of the board, and on the other side of the board 20, the remainder of the conductors 28 have portions 34 that terminate in spaced relation to the board edge 24. As shown, the conductor portions 30 and 34 extend in spaced parallel relation longitudinally of the board and are in relative staggered relation.

The plate 22 like the board 20 is preferably made of a plastic or other suitable electrical insulating material, and secured in and to the plate 22 is a plurality of conductors 36 and 38 that extend through and are substantially flush with both side surfaces of the plate. Each of the conductors 36, 38 has a connector end 40 and these connectors are radially spaced and apertured to receive the conventionally radially spaced prongs 42 of the socket member 26. Conductors 36 each have a terminal 44 on the other ends thereof from the connectors 40, the terminals being arranged in a row outwardly from and in a plane parallel to one side of board 20. Similarly, the conductors 38 have terminals 46 arranged in a row parallel to the row of terminals 44, but on the other side of board 20 from terminals 44. The plate 22 is also provided with a pair of centrally located spaced terminals 48 and 50 which are provided for a ground connection.

In order to mount the socket plate 22 securely on the edge 24 of the circuit board 20 and at the same time electrically connect the socket 26 to the conductors 32, I provide two rows of conductor-braces 52 and 54. As shown, the conductor-braces 52 are triangular in shape having side edges thereof seating on and connected respectively to the plate terminals 44, and having adjacent side edges seating on and connected to end portions 30 of the printed circuit on one side of board 20. Similarly, the conductor-braces 54 have side edges connected respectively to the plate terminals 46 and seat on the end portion 34 of the circuit board conductors 28. This arrangement provides two rows of conductor-braces on the socket mounting plate 22 to receive the edge of board 20 therebetween. To accommodate the several circuits and to equally distribute the bracing action, the conductor-braces of one row thereof are arranged in staggered relation to the conductor-braces of the other row such that they in effect, define a socket into which the edge of board 20 is fitted. Securing of the conductor-braces 52 and 54 to the plate terminals 44, 46 and to the end portions 30, 34 of the printed circuit conductors may be done by the well known dip soldering process or in any other suitable manner. To insure satisfactory electrical connections between the conductor-braces 52, 54 and the terminals 44, 46, the terminals are apertured to receive projections 56 on the conductor-braces, which projections also retain the conductor-braces in place during the dip soldering operation.

The row of conductor-braces 52, of which there are five in the present assembly, preferably has a relatively large center brace 53 to increase rigidity of the construction, the brace also being used as a conductor connection to ground terminals 48 and 50 on the plate 22 and to a ground conductor 58 on the circuit board 20. Preferably, the conductor end portion 58 to which the large conductor-brace 53 is connected is apertured to receive a projection 60 on the conductor-brace, the projection 60 extending into board 20 in a hole 62 that is filled with solder to provide a good electrical connection and to anchor the brace securely to board 20.

From the foregoing description, it will be appreciated that I have provided an improved assembly structure for electronic components which is a compact unit thicknesswise for assembly in a space restricted area. It will be seen that compactness of the unit assembly is accomplished by mounting the socket on an edge of the board by conductor-braces which in addition to functioning as conductors, rigidly secure the socket mounting to the circuit board in such manner that compactness is gained without sacrifice of rigidity and without requiring any undesirable additional circuitry.

While I have shown and described my invention in considerable detail, it will be understood that the invention is subject to many variations without departing from the spirit and scope thereof.

What is claimed is:

1. A socket terminal unit for attachment to an edge of a printed circuit board comprising, a mounting plate, a plurality of terminals on and extending through said mounting plate, a multiple electric socket member mounted on one side of said plate with the sockets electrically connected, respectively, to said terminals, a relatively large triangular conductor-brace attached at one side edge thereof to the other side of said mounting plate and extending transversely thereto, a plurality of relatively small triangular conductor-braces arranged in spaced parallel relation on both sides of said relatively large conductor-brace, said relatively large and small conductor-braces connected to respective ones of said terminals and having corresponding side edges attached to said other side of said mounting plate and having the other side edges thereof coplanar in a plane transverse to said mounting plate, and a second plurality of triangular conductor-braces arranged in spaced parallel relation having corresponding side edges attached to the said other side of said mounting plate and connected to respective ones of said terminals, said second plurality of conductor-braces extending transversely with the other corresponding side edges of the second plurality of conductor braces of said mounting plate coplanar in a plane parallel to and spaced from the plane of the first plurality of conductor-braces, said spaced coplanar edges to receive the printed circuit board therebetween.

2. A socket terminal unit for attachment to an edge of a printed circuit board comprising, a mounting plate of electric insulating material, a plurality of conductor members on and extending through said plate to opposite sides thereof, a multiple electric socket member mounted on one side of said mounting plate with the multiple sockets respectively connected electrically with said conductor members, a row of triangular conductor-braces disposed on the other side of said plate from said socket member, said conductor-braces arranged in parallel spaced relation transverse to said mounting plate with corresponding side edges of the conductor-braces attached to the said other side of said plate and respectively connected electrically to a number of said conductor members, a second row of triangular conductor-braces disposed on the said other side of said mounting plate in spaced parallel relation to the first row of conductor-braces and respectively connected electrically to the other of said conductor members, said second row of conductor-braces having corresponding side edges connected to said other side of said mounting plate and extending transverse thereto, and said rows of triangular braces having the side edges adjacent said first side edges in spaced parallel relation to receive the printed circuit board therebetween.

3. A socket terminal unit for attachment to an edge of a printed circuit board comprising, a mounting plate of electric insulating material, a row of electrical terminals secured in and to said mounting plate, a second row of electrical terminals secured in and to said mounting plate and parallel to said first row of terminals, a multiple socket member mounted on one side of said mounting plate with the multiple sockets respectively connected to the terminals of said rows of terminals, a row of conductor-braces on the other side of said mounting plate from said socket member and extending transversely thereto, said conductor-braces having corresponding side edges thereof against the said other side of said mounting plate and extended portions projecting through said mounting plate into contact respectively with said first row of electrical terminals, a second row of conductor-braces parallel to the first and in spaced relation thereto, said second row of conductor-braces having corresponding side edges against said other side of said mounting plate and extended portions projecting through said mounting plate into contact respectively with the terminals of said second row, the other corresponding side edges of the conductor-braces of each row being coplanar to receive an edge portion of the circuit board therebetween.

4. An electrical component assembly comprising, a mounting plate of electric insulating material, a plurality of electric conductor members on and extending through said mounting plate to opposite sides thereof including a pair of aligned terminals for a ground connection, a multiple electric socket member mounted on one side of said mounting plate with the multiple sockets electrically connected respectively to said conductor members, a relatively large triangular conductor-brace on the other side of said mounting plate transverse thereto with one side edge of the conductor-brace attached to the mounting plate and bridging said pair of aligned terminals, a plurality of relatively small triangular conductor-braces on opposite sides of said relatively large conductor-brace having corresponding side edges attached to the said other side of said mounting plate and electrically connected to corresponding ones of said conductor members, said relatively large conductor-brace and said relatively small conductor-braces arranged in spaced apart relation in a row and having the side edges thereof adjacent said first side edges in coplanar relationship, a second row of relatively small conductor-braces parallel to and spaced from the first row of conductor-braces, said second row of conductor braces having corresponidng side edges attached to the said other side of said mounting plate and electrically connected to corresponding ones of said conductor members, said second plurality of conductor-braces having the other side edges thereof in relative coplanar relation and spaced from the coplanar edges of said first row of conductor-braces, a circuit board having a margin thereof received between said rows of conductor-braces, and conductor members on said board engaged and electrically connected to said first conductor members by said rows of conductor-braces.

References Cited in the file of this patent

UNITED STATES PATENTS

| | | |
|---|---|---|
| 2,443,706 | Jansen | June 22, 1948 |
| 2,829,359 | Ritter | Apr. 1, 1958 |

OTHER REFERENCES

Aerovox "Electronics," April 1, 1957, page 206.